United States Patent
Han et al.

(10) Patent No.: US 10,116,259 B2
(45) Date of Patent: Oct. 30, 2018

(54) INDUCTOR-ENCLOSED VOLTAGE-CONTROLLED OSCILLATORS

(71) Applicant: QUALCOMM Incorporated, San Diego, CA (US)

(72) Inventors: Yiping Han, San Diego, CA (US); Yung-Chung Lo, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 437 days.

(21) Appl. No.: 14/548,691

(22) Filed: Nov. 20, 2014

(65) Prior Publication Data

US 2015/0349711 A1 Dec. 3, 2015

Related U.S. Application Data

(60) Provisional application No. 62/004,741, filed on May 29, 2014.

(51) Int. Cl.
*H04B 1/38* (2015.01)
*H03B 5/12* (2006.01)

(52) U.S. Cl.
CPC ............. *H03B 5/12* (2013.01); *H03B 5/1243* (2013.01); *H04B 1/38* (2013.01); *H03B 2201/025* (2013.01)

(58) Field of Classification Search
CPC .. H03B 2201/025; H03B 5/12; H03B 5/1243; H04B 1/38
USPC .................................................... 455/73, 333
See application file for complete search history.

(56) References Cited

U.S. PATENT DOCUMENTS

| | | | |
|---|---|---|---|
| 6,670,833 | B2 | 12/2003 | Kurd et al. |
| 6,879,234 | B2 | 4/2005 | Furumiya et al. |
| 6,940,355 | B2 | 9/2005 | Hajimiri et al. |
| 2003/0001709 | A1 | 1/2003 | Visser |
| 2005/0189995 | A1 | 9/2005 | Kee et al. |
| 2010/0238843 | A1* | 9/2010 | Taghivand ..................... 370/277 |
| 2010/0308924 | A1* | 12/2010 | Rangarajan et al. ........... 331/48 |
| 2011/0063038 | A1* | 3/2011 | Ainspan .................. H03L 7/099 331/47 |
| 2012/0242406 | A1 | 9/2012 | Ke |
| 2014/0070898 | A1* | 3/2014 | Shirinfar et al. ........ 331/117 FE |
| 2014/0232598 | A1 | 8/2014 | Dai et al. |

OTHER PUBLICATIONS

International Search Report and Written Opinion—PCT/US2015/029587—ISA/EPO—dated Jul. 14, 2015.

* cited by examiner

*Primary Examiner* — Xin Jia
(74) *Attorney, Agent, or Firm* — Patterson & Sheridan, L.L.P.

(57) ABSTRACT

Certain aspects of the present disclosure provide an inductor-enclosed switchable voltage-controlled oscillator (VCO), for use in a frequency synthesizer of a radio frequency integrated circuit (RFIC), for example. One example apparatus is a frequency synthesizer that generally includes a first VCO circuit comprising a first inductor and a second VCO circuit comprising a second inductor, wherein at least a portion of the first VCO circuit is disposed inside a loop of the second inductor. According to certain aspects, at least a portion of the second VCO circuit is disposed inside a loop of the first inductor.

15 Claims, 7 Drawing Sheets

INDUCTOR-ENCLOSED VOLTAGE-CONTROLLED OSCILLATORS

CROSS-REFERENCE TO RELATED APPLICATION

This application claims the benefit of U.S. Provisional Patent Application Ser. No. 62/004,741, entitled "INDUCTOR-ENCLOSED SWITCHABLE VOLTAGE CONTROLLED OSCILLATORS" and filed May 29, 2014, which is herein incorporated by reference in its entirety.

TECHNICAL FIELD

Certain aspects of the present disclosure generally relate to radio frequency (RF) circuits and, more particularly, to layout of voltage-controlled oscillators (VCOs) in an integrated circuit (IC).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to disposing a portion of a first voltage-controlled oscillator (VCO) circuit inside an inductor of a second VCO circuit. For certain aspects, a portion of the second VCO circuit may be located inside an inductor of the first VCO circuit. This reduces the area occupied by the first and second VCO circuits, without degrading inductor quality factor (Q) and phase noise performance.

Certain aspects of the present disclosure provide a frequency synthesizer. The frequency synthesizer generally includes a first VCO circuit comprising a first inductor and a second VCO circuit comprising a second inductor. At least a portion of the first VCO circuit is disposed inside a loop of the second inductor.

According to certain aspects, a portion of the second VCO circuit is disposed inside a loop of the first inductor.

According to certain aspects, at least one of the first inductor or the second inductor has a single turn.

According to certain aspects, the first VCO circuit includes a resonant tank circuit comprising the first inductor and a varactor; a negative active transconductance circuit connected with the resonant tank circuit; and a bias current circuit for sourcing or sinking a bias current through the resonant tank circuit and the negative active transconductance circuit to generate an oscillating signal. For certain aspects, at least a portion of the first VCO circuit includes the negative active transconductance circuit and the varactor. For certain aspects, the bias current circuit is at least partially disposed outside the loop of the second inductor.

According to certain aspects, the first VCO circuit is configured to generate an oscillating signal having a lower frequency than the second VCO circuit. For other aspects, the first VCO circuit is configured to generate an oscillating signal having a higher frequency than the second VCO circuit.

According to certain aspects, the first VCO circuit is configured to be powered off when the second VCO circuit is active. In this manner, the first and second VCO circuits are switchable. For certain aspects, the second VCO circuit is configured to be powered off when the first VCO circuit is active.

Certain aspects of the present disclosure provide an integrated circuit (IC). The IC generally includes a mixing circuit configured to frequency convert an input signal with an oscillating signal and a frequency synthesizer configured to generate the oscillating signal. The frequency synthesizer typically includes a first VCO circuit comprising a first inductor and a second VCO circuit comprising a second inductor. At least a portion of the first VCO circuit is disposed inside a loop of the second inductor.

According to certain aspects, the IC is a radio frequency integrated circuit (RFIC). The RFIC may be a transceiver IC, a transmitter IC, or a receiver IC.

According to certain aspects, at least a portion of the second VCO circuit is disposed inside a loop of the first inductor.

According to certain aspects, at least one of the first inductor or the second inductor has a single turn.

According to certain aspects, the first VCO circuit includes a resonant tank circuit comprising the first inductor and a varactor; a negative active transconductance circuit connected with the resonant tank circuit; and a bias current circuit for sourcing or sinking a bias current through the resonant tank circuit and the negative active transconductance circuit to generate the oscillating signal. For certain aspects, the at least the portion of the first VCO circuit includes the negative active transconductance circuit and the varactor. The bias current circuit may be at least partially disposed outside the loop of the second inductor.

According to certain aspects, the oscillating signal is generated by the first VCO circuit and has a lower frequency than that generated by the second VCO circuit.

According to certain aspects, the first VCO circuit is configured to be powered off when the second VCO circuit is active.

Certain aspects of the present disclosure provide an apparatus for wireless communications. The apparatus generally includes at least one antenna; and at least one of a receiver configured to receive, or a transmitter configured to send, a radio frequency (RF) signal via the at least one antenna. The at least one of the receiver or the transmitter has a frequency synthesizer composed of a first VCO circuit comprising a first inductor and a second VCO circuit comprising a second inductor. At least a portion of the first VCO circuit is disposed inside a loop of the second inductor.

According to certain aspects, at least a portion of the second VCO circuit is disposed inside a loop of the first inductor.

Certain aspects of the present disclosure provide a method of laying out a frequency synthesizer. The method generally includes arranging a first VCO circuit comprising a first inductor and arranging a second VCO circuit comprising a second inductor, such that at least a portion of the second VCO circuit is disposed inside a loop of the first inductor.

According to certain aspects, arranging the second VCO circuit involves routing the second inductor such that at least a portion of the first VCO circuit is disposed inside a loop of the second inductor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
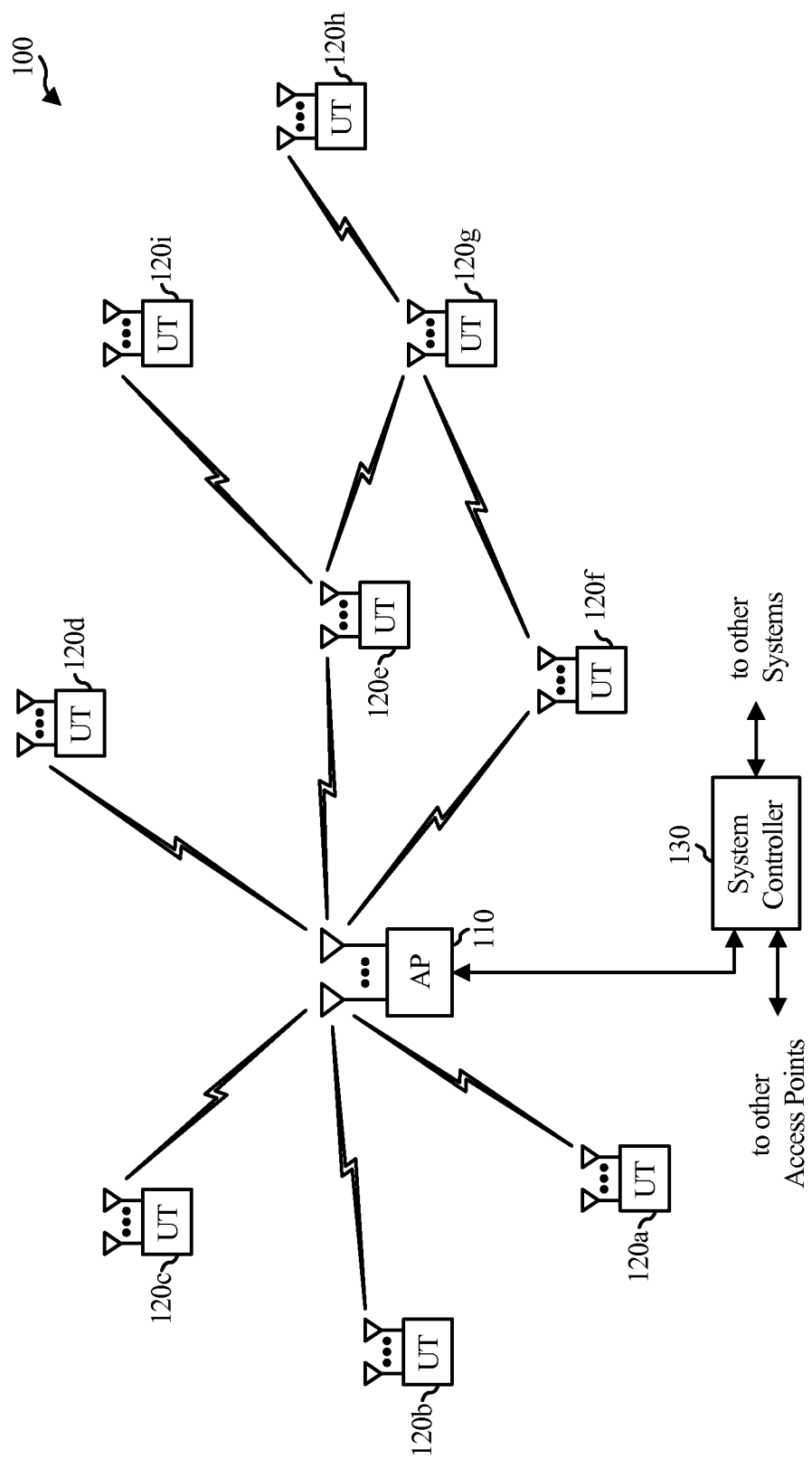
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
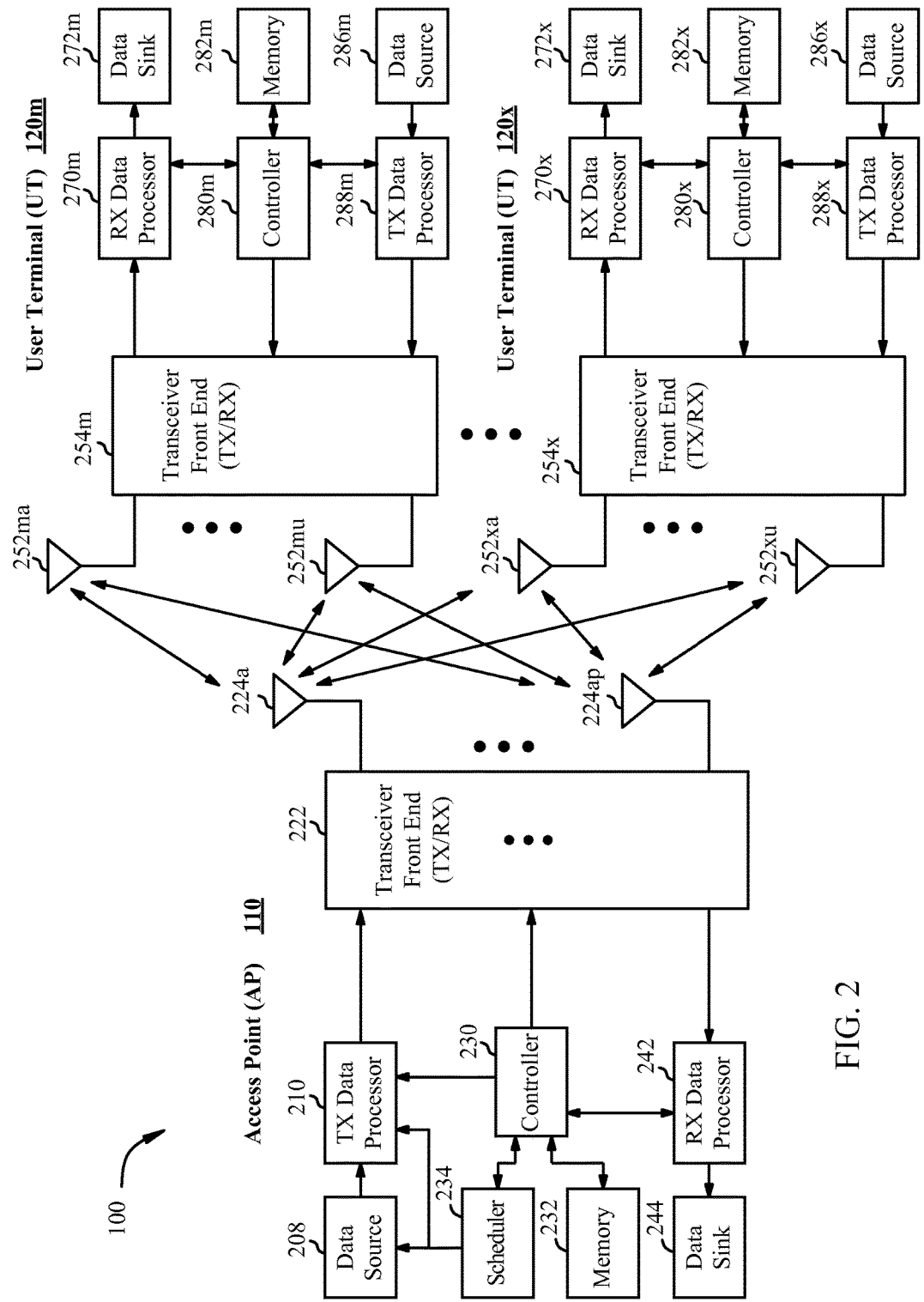
FIG. 2 is a block diagram of an example access point (AP) and example user terminals in accordance with certain aspects of the present disclosure.

FIG. 2 shows a block diagram of access point 110 and two user terminals 120*m* and 120*x* in wireless system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
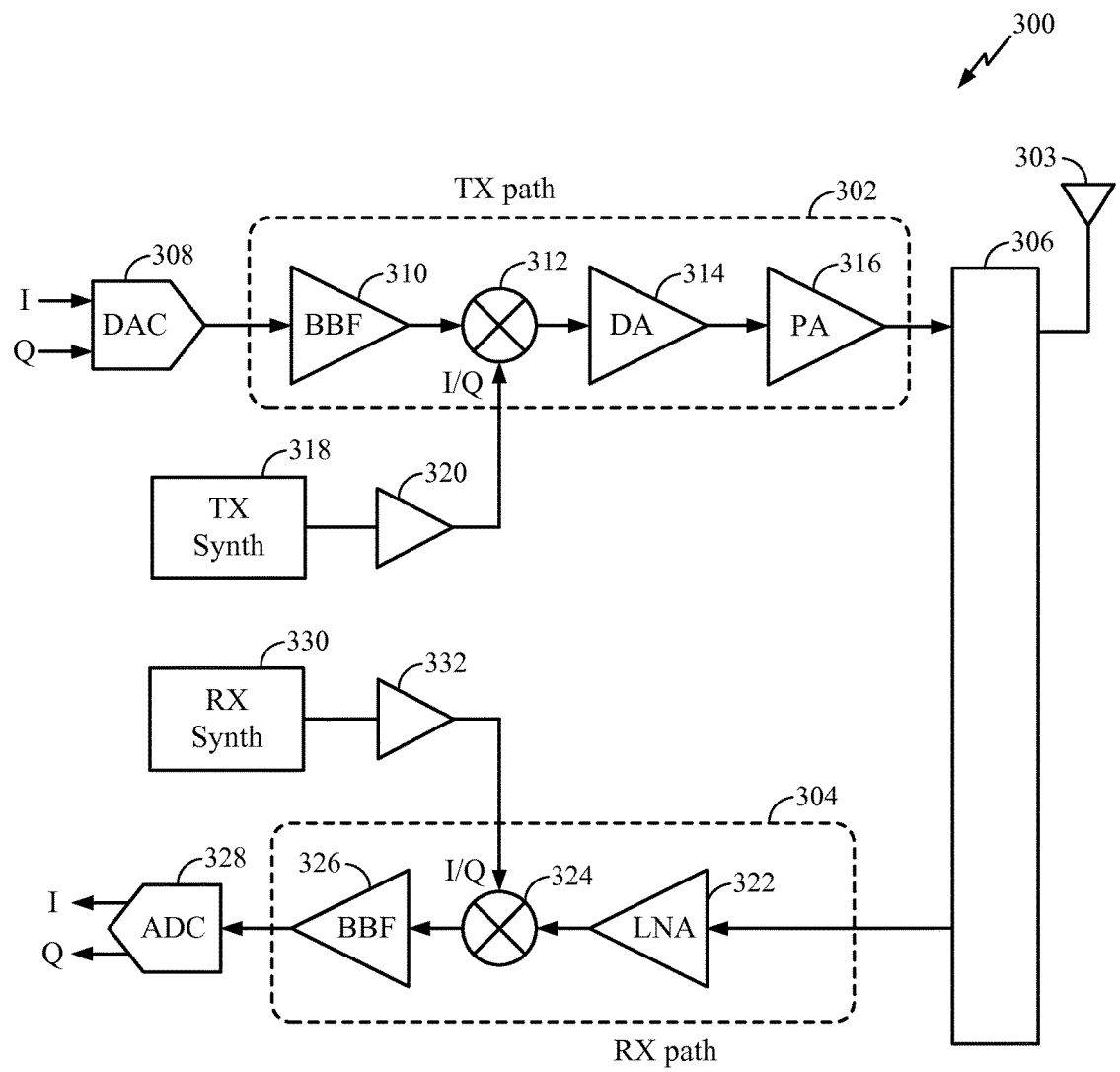
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Inductor-Enclosed Switchable VCO

Two VCOs may be utilized to cover the frequency bandwidth in each of the TX and RX paths 302, 304, one VCO for lower frequencies and the other VCO for higher frequencies. Having two VCOs typically occupies a significant portion of the available area in a frequency synthesizer, mainly due to the space taken by the inductor in each VCO. As a result, the two VCOs can occupy about 65% of the synthesizer's area. Although the present disclosure mainly refers to arranging two VCO circuits for ease of description, the ideas disclosed herein may be applied to more than two VCO circuits, such as in frequency synthesizers with four VCO circuits.

Several options are available for designing and arranging the VCO circuitry, with varying effects. In a first option, a portion of each VCO circuit may be placed underneath (or above) its corresponding inductor (in two different planes). However, this approach degrades the inductor quality factor (Q) and phase noise performance due to the close proximity of the VCO circuit and the inductor.

Figure 4:
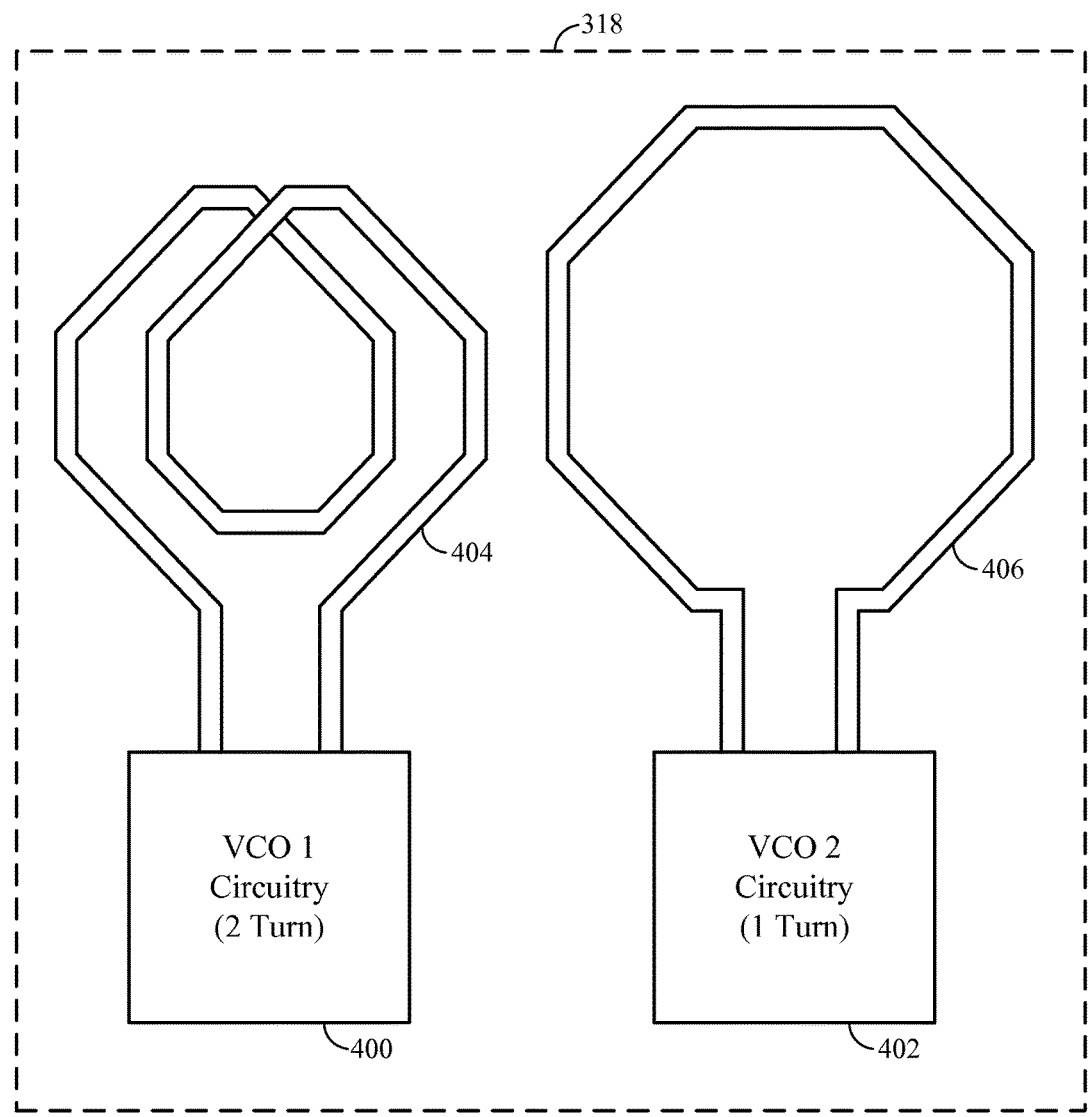
FIG. 4 illustrates a first VCO circuit having a dual-turn inductor and a second VCO circuit having a single-turn inductor in accordance with the prior art.
Figure 5:
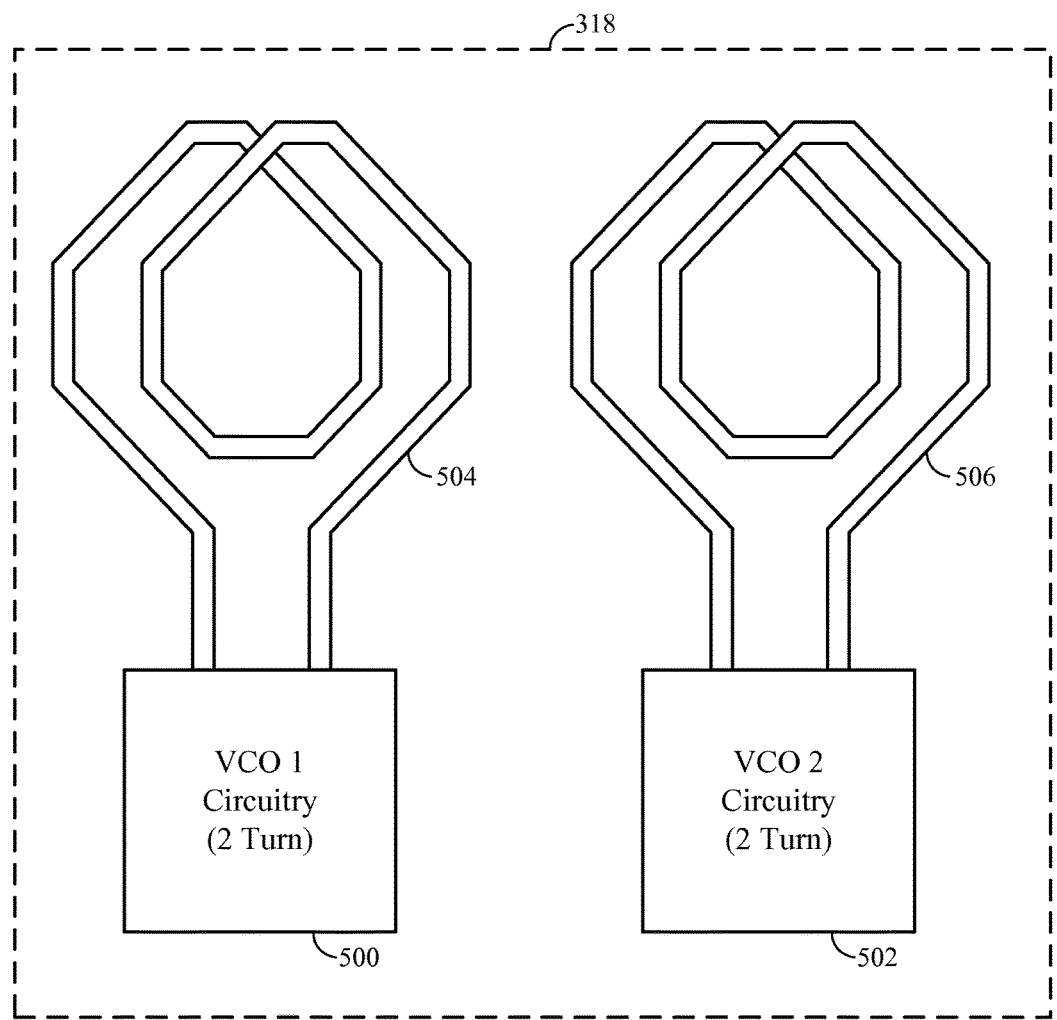
FIG. 5 illustrates two prior art VCO circuits having dual-turn inductors.

In a second option, a dual-turn inductor may be used to reduce the loop area of the inductor. FIG. 4 illustrates an example TX frequency synthesizer 318 in which a first VCO circuit 400 includes a dual-turn inductor 404 and a second VCO circuit 402 includes a single-turn inductor 406. FIG. 5 illustrates another example TX frequency synthesizer 318 in which both the first VCO circuit 500 and the second VCO circuit 502 include dual-turn inductors 504, 506. As illustrated by FIGS. 4 and 5, however, this approach does not significantly reduce the total area occupied by the VCO(s).

Accordingly, what is needed are techniques and apparatus for a VCO layout that reduces the area occupied by the VCOs, preferably without degrading inductor Q and phase noise performance.

Certain aspects of the present disclosure provide for disposing at least a portion of a first VCO circuit inside the inductor of a second VCO circuit, while at least a portion of the second VCO circuit may be disposed inside the inductor of the first VCO circuit. This approach reduces the area occupied by the two VCOs without sacrificing the Q and phase noise performance of the inductors. By positioning at least a portion of the first VCO circuit inside the inductor of the second VCO circuit (and vice versa), phase noise performance is not adversely impacted because only a single VCO circuit is typically active at any one time to generate the local oscillator (LO) frequency output by the TX or RX frequency synthesizer 318, 330, hence the term "switchable VCOs."

Figure 6:
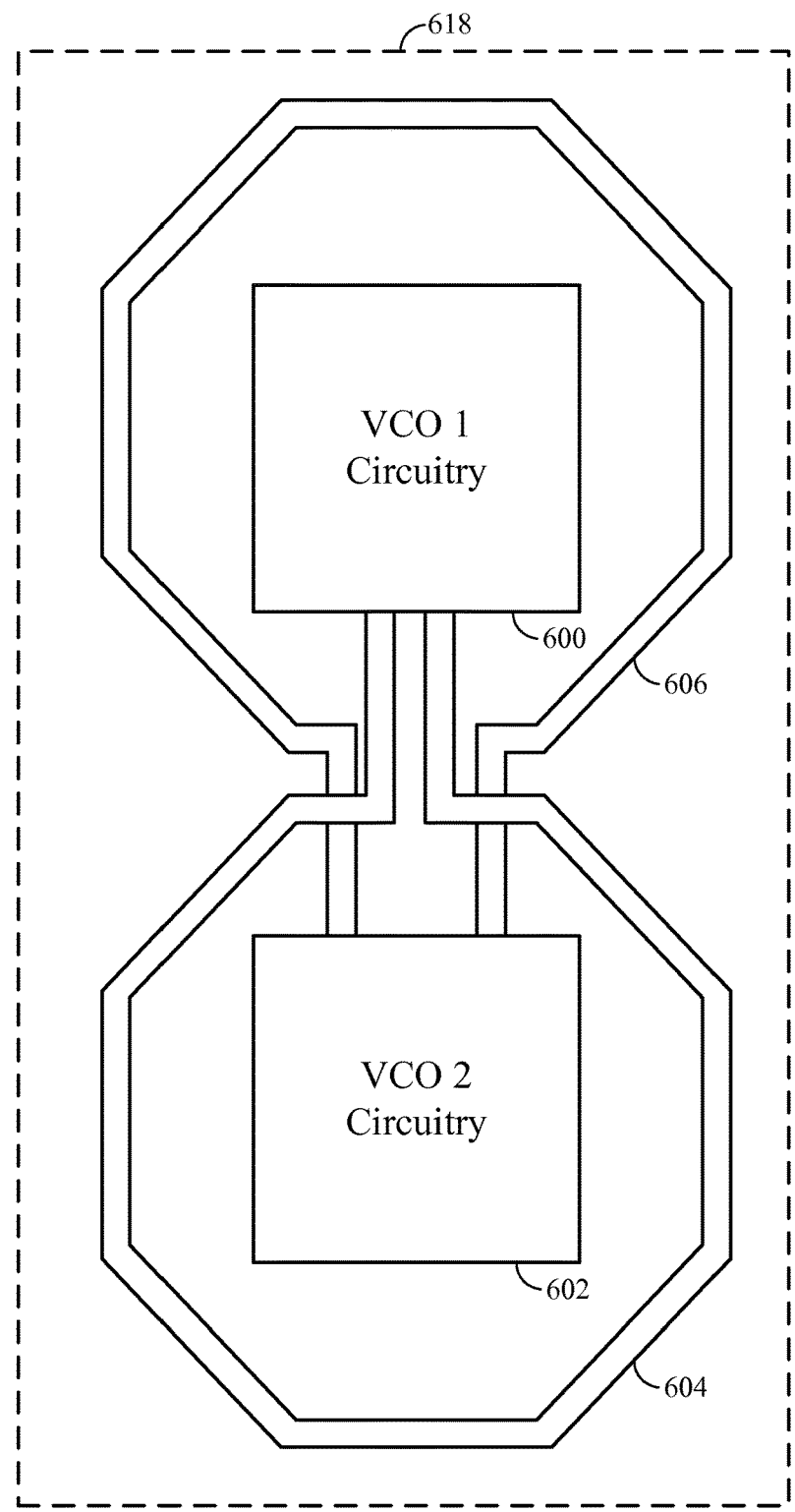
FIG. 6 illustrates a portion of a first VCO circuit situated inside the inductor of a second VCO circuit and a portion of the second VCO circuit situated inside the inductor of the first VCO circuit, in accordance with certain aspects of the present disclosure.

FIG. 6 illustrates a frequency synthesizer 618 (e.g., TX frequency synthesizer 318 or RX frequency synthesizer 330) comprising a first VCO circuit 600 with a first inductor 604 and a second VCO circuit 602 with a second inductor 606. A portion of the first VCO circuit 600 is situated inside the loop area of the second inductor 606, and a portion of the second VCO circuit 602 is situated inside the loop area of the first inductor 604. As illustrated in FIG. 6, a portion of the first VCO circuit 600 is disposed in relation to the second inductor 606 such that the path of the loop portion of the second inductor 606 at least partially encloses the first VCO circuit portion. Enclosure by the loop portion of the second inductor 606 may be partial, as shown. For example, the enclosure by the second inductor 606 may be interrupted to permit passage of a portion of the first inductor 604 in the first VCO circuit 600. Likewise, a portion of the second VCO circuit 602 may be similarly disposed in relation to the first inductor 604 such that the path of the loop portion of the first inductor 604 at least partially encloses the second VCO circuit portion. The components comprising the switchable VCO circuits in frequency synthesizer 618 (e.g., first VCO circuit 600 with first inductor 604 and second VCO circuit 602 with second inductor 606) may be disposed on substantially the same plane or surface. Accommodation may be provided for routing of the first inductor 604 with respect to the second inductor 606 as may be provided in various configurations.

This approach may result in an area reduction in the two VCOs of over 20% (e.g., 35%). Table 1 illustrates an example of the VCO area savings of the configurations as illustrated in FIGS. 5 and 6 relative to the configuration illustrated in FIG. 4.

TABLE 1

| CONFIGURATION | % of VCO area savings |
|---|---|
| FIG. 4 - a single-turn and a dual-turn inductor | 0% |
| FIG. 5 - two dual-turn inductors | 20% |
| FIG. 6 - first VCO circuit portion inside the inductor of the second VCO circuit and vice versa | 35% |

Moreover, the configuration in FIG. 6, utilizing a single-turn inductor enclosing a portion of another VCO circuit, may also result in an inductor Q increase of roughly 15% as compared to using a dual-turn inductor.

Figure 7:
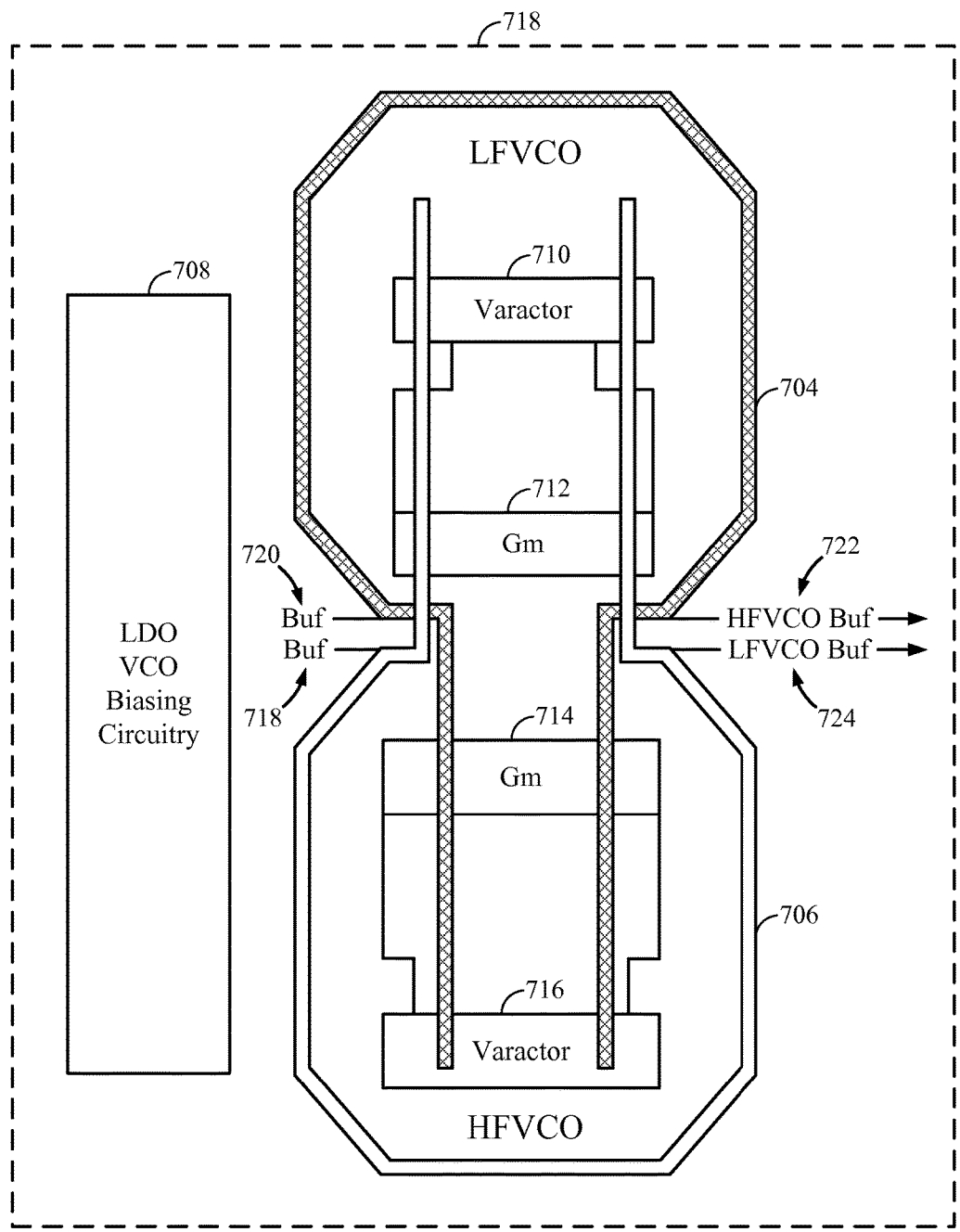
FIG. 7 illustrates an example layout of inductor-enclosed dual switchable VCOs, in accordance with certain aspects of the present disclosure.

As illustrated in the example layout of FIG. 7, certain aspects of the present disclosure may also offer easier routing of the VCO low-dropout regulator (LDO) and the VCO biasing circuitry 708. FIG. 7 illustrates a frequency synthesizer 718 (e.g., TX frequency synthesizer 318 or RX frequency synthesizer 330) comprising a low frequency VCO (LFVCO) circuit and a high frequency VCO (HFVCO) circuit. The LFVCO circuit includes a first varactor 710 and a first negative active transconductance (−Gm) circuit 712 connected with a first single-turn inductor 706. The HFVCO circuit includes a second varactor 716 and a second negative active transconductance (−Gm) circuit 714 connected with a second single-turn inductor 704. FIG. 7 also illustrates input buffers 718, 720 and output buffers 722, 724 to connect the VCO circuits to other circuitry, in or external to the frequency synthesizer 718.

As illustrated in FIG. 7, a portion of the LFVCO circuit is disposed in relation to the second inductor 704 such that the path of the loop portion of the second inductor 704 at least partially encloses the LFVCO circuit portion. Enclosure by the loop portion of the second inductor 704 may be partial, as depicted. Likewise, a portion of the HFVCO circuit may be similarly disposed in relation to the first inductor 706 such that the path of the loop portion of the first inductor 706 at least partially encloses the HFVCO circuit portion. Enclosure by the loop portion of the first inductor 706 may be partial. For example, the enclosure by the first inductor 706 may be interrupted to permit passage of a portion of the second inductor 704 in the HFVCO circuit. The components comprising the switchable VCO circuits in frequency synthesizer 718 (e.g., the LFVCO circuit with first inductor 706 and the HFVCO circuit with second inductor 704) may be disposed on substantially the same plane or surface. Accommodation may be provided for routing of the first inductor 706 with respect to the second inductor 704 as may be provided in various configurations.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, a-b-c, and any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A frequency synthesizer, comprising:
    a first voltage-controlled oscillator (VCO) circuit comprising a first inductor; and
    a second VCO circuit comprising a second inductor, wherein at least a portion of the first VCO circuit is disposed inside a loop of the second inductor, wherein at least a portion of the second VCO circuit is disposed inside a loop of the first inductor, wherein the portion of the first VCO circuit comprises a negative active transconductance circuit and a varactor of the first VCO circuit, and wherein the portion of the second VCO circuit comprises a negative active transconductance circuit and a varactor of the second VCO circuit.

2. The synthesizer of claim 1, wherein at least one of the first inductor or the second inductor has a single turn.

3. The synthesizer of claim 1, wherein the first VCO circuit comprises:
    a resonant tank circuit comprising the first inductor and the varactor;
    the negative active transconductance circuit connected with the resonant tank circuit; and
    a bias current circuit for sourcing or sinking a bias current through the resonant tank circuit and the negative active transconductance circuit.

4. The synthesizer of claim 3, wherein the bias current circuit is at least partially disposed outside the loop of the second inductor.

5. The synthesizer of claim 1, wherein the first VCO circuit is configured to generate an oscillating signal having a lower frequency than the second VCO circuit.

6. The synthesizer of claim 1, wherein the first VCO circuit is configured to be powered off when the second VCO circuit is active.

7. An integrated circuit (IC), comprising:
    a mixing circuit configured to frequency convert an input signal with an oscillating signal; and
    a frequency synthesizer configured to generate the oscillating signal, comprising:
        a first voltage-controlled oscillator (VCO) circuit comprising a first inductor; and
        a second VCO circuit comprising a second inductor, wherein at least a portion of the first VCO circuit is disposed inside a loop of the second inductor, wherein at least a portion of the second VCO circuit is disposed inside a loop of the first inductor, wherein the portion of the first VCO circuit comprises a negative active transconductance circuit and a varactor of the first VCO circuit, and wherein the portion of the second VCO circuit comprises a negative active transconductance circuit and a varactor of the second VCO circuit.

8. The IC of claim 7, wherein the IC is a radio frequency integrated circuit (RFIC).

9. The IC of claim 8, wherein the RFIC is a transceiver IC or a receiver IC.

10. The IC of claim 7, wherein at least one of the first inductor or the second inductor has a single turn.

11. The IC of claim 7, wherein the first VCO circuit comprises:
    a resonant tank circuit comprising the first inductor and the varactor;
    the negative active transconductance circuit connected with the resonant tank circuit; and
    a bias current circuit for sourcing or sinking a bias current through the resonant tank circuit and the negative active transconductance circuit to generate the oscillating signal.

12. The IC of claim 11, wherein the bias current circuit is at least partially disposed outside the loop of the second inductor.

13. The IC of claim 7, wherein the oscillating signal is generated by the first VCO circuit and has a lower frequency than that generated by the second VCO circuit.

14. The IC of claim 7, wherein the first VCO circuit is configured to be powered off when the second VCO circuit is active.

15. An apparatus for wireless communications, comprising:
    at least one antenna; and
    at least one of a receiver configured to receive, or a transmitter configured to send, a radio frequency (RF) signal via the at least one antenna, the at least one of the receiver or the transmitter having a frequency synthesizer comprising:
        a first voltage-controlled oscillator (VCO) circuit comprising a first inductor; and
        a second VCO circuit comprising a second inductor, wherein at least a portion of the first VCO circuit is disposed inside a loop of the second inductor, wherein at least a portion of the second VCO circuit is disposed inside a loop of the first inductor, wherein the portion of the first VCO circuit comprises a negative active transconductance circuit and a varactor of the first VCO circuit, and wherein the portion of the second VCO circuit comprises a negative active transconductance circuit and a varactor of the second VCO circuit.

* * * * *